United States Patent [19]
Tabota et al.

[11] Patent Number: 5,914,556
[45] Date of Patent: Jun. 22, 1999

[54] PIEZOELECTRIC ELEMENT AND METHOD OF MANUFACTURING THE SAME

[75] Inventors: Jun Tabota; Toshihiko Unami, both of Toyama-ken; Jiro Inoue, Toyama, all of Japan

[73] Assignee: Murata Manufacturing Co., Ltd., Japan

[21] Appl. No.: 08/460,660

[22] Filed: Jun. 2, 1995

[30] Foreign Application Priority Data

Sep. 9, 1994 [JP] Japan ..................................... 6-215881
Dec. 12, 1994 [JP] Japan ..................................... 6-307442

[51] Int. Cl.$^6$ .................................................. H01L 41/08
[52] U.S. Cl. ......................... 310/328; 310/359; 310/366
[58] Field of Search ................................. 310/359, 331, 310/366, 332, 328, 320, 321, 365; 73/1 D, 514.34

[56] References Cited

U.S. PATENT DOCUMENTS

| | | | |
|---|---|---|---|
| 3,816,774 | 6/1974 | Ohnuki et al. | 310/331 |
| 4,564,782 | 1/1986 | Ogawa | 310/359 |
| 5,248,912 | 9/1993 | Zdeblick et al. | 310/332 |
| 5,402,159 | 3/1995 | Takahashi et al. | 310/366 |
| 5,473,930 | 12/1995 | Gademann et al. | 73/1 D |
| 5,490,422 | 2/1996 | Tabota et al. | 73/514.34 |
| 5,515,725 | 5/1996 | Tabota et al. | 73/574.34 |

*Primary Examiner*—Thomas M. Dougherty
*Attorney, Agent, or Firm*—Osterolenk, Faber, Gerb & Soffen, LLP

[57] ABSTRACT

A piezoelectric element includes an internal electrode embedded in a piezoelectric ceramic body so as to extend in a longitudinal direction of the body. First to third surface electrodes are formed on upper and lower surfaces of the piezoelectric ceramic body in respective first to third portions along the longitudinal direction. Connecting electrodes are formed to connect the first to third surface electrodes with each other. The first to third portions are polarized so that the second portion is polarized opposite to the polarization of the first and third portions, and regions located above and below the internal electrode are polarized in opposite directions in the respective ones of the first to third portions.

5 Claims, 9 Drawing Sheets

PIEZOELECTRIC ELEMENT AND METHOD OF MANUFACTURING THE SAME

BACKGROUND OF THE INVENTION

1. Field of the Invention

The present invention relates to a piezoelectric element and a method of manufacturing the piezoelectric element, and more particularly, the present invention relates to a bimorph piezoelectric element which may be used in forming an acceleration sensor and a method of manufacturing the piezoelectric element.

2. Description of the Background Art

In general, an acceleration sensor including a piezoelectric element may be used for detecting impact or the like. With reference to FIG. 1, one example of a piezoelectric element 1 will be described.

The piezoelectric element 1 has a piezoelectric ceramic body 2. First, second and third surface electrodes 3, 4 and 5, respectively are formed on an upper surface of the piezoelectric ceramic body 2 by a thin film forming method such as sputtering. The electrodes 3, 4, and 5 are space at longitudinal intervals along the piezoelectric ceramic body 2. Further, a first connecting electrode 6 is formed on the upper surface of the piezoelectric ceramic body 2, for electrically connecting the first to third surface electrodes 3 to 5 with each other. A first signal drawing electrode is formed by the first to third surface electrodes 3 to 5 and the first connecting electrode 6.

On the other hand, first, second and third surface electrodes 7, 8 and 9 are formed on a lower surface of the piezoelectric ceramic body 2 in first to third portions thereof respectively, by a thin film forming method. A second connecting electrode 10 is formed to at least partially cover the first to third surface electrodes 7 to 9, for electrically connecting the electrodes with each other. A second signal drawing electrode is formed by the first to third surface electrodes 7 to 9 and the second connecting electrode 10.

The piezoelectric ceramic body 2 has a longitudinally extending internal electrode 11 located at an intermediate vertical position. As shown in FIG. 1, the internal electrode 11 does not extend to either longitudinal end of the piezoelectric ceramic body 2.

The interior of the piezoelectric ceramic body 2 is polarized in a manner described in the following paragraph. In a piezoelectric ceramic body region 2A which is located above the portion provided with the internal electrode 11, the second portion is downwardly polarized as shown by arrow B while the first and third portions are upwardly polarized as shown by arrows A and C, respectively. In a piezoelectric ceramic body region 2B which is located under the internal electrode 11, the first to third portions are polarized oppositely to the polarization directions of the piezoelectric ceramic body region 2A which is located above the internal electrode 11, as shown by arrows D, E and F, respectively. In other words, the upper and lower piezoelectric ceramic body regions 2A and 2B are polarized in opposite directions in each of the first to third portions. In each of the respective piezoelectric ceramic body regions 2A and 2B, the second portion and the first and third portions are polarized in opposite directions.

On the upper surface of the piezoelectric ceramic body 2, the first surface electrode 3 extends to a side edge of the piezoelectric ceramic body 2, whereby an end of the first signal drawing electrode which is located on the upper surface extends to this side surface of the piezoelectric ceramic body 2. On the lower surface of the piezoelectric ceramic body 2, the third surface electrode 9 is also formed to extend to another side edge of the piezoelectric ceramic body 2, whereby the second signal drawing electrode which is located on the lower surface extends to this side edge of the piezoelectric ceramic body 2.

Broken lines G and H show the respective boundaries between the first to third portions of the piezoelectric ceramic body 2. The first, second and third portions are located on the left side of the boundary G, between the boundaries G and H, and on the right side of the boundary H, respectively.

The piezoelectric ceramic body 2 is held by frame bodies 12 and 13 which are arranged on respective upper and lower portions thereof. Each of the frame bodies 12 and 13 is made of insulating ceramics such as alumina or another material having a desired rigidity, and has a flat plate portion and a pair of fixed portions extending toward the piezoelectric ceramic body 2 from both ends of the flat plate portion. The frame body 12 is fixed to the upper surface of the piezoelectric ceramic body 2 at forward ends of the pair of fixed portions. Similarly, the frame body 13 is fixed to the lower surface of the piezoelectric ceramic body 2 at forward ends of the pair of fixed portions.

The piezoelectric element 1 has such a structure such that the frame bodies 12 and 13 are fixed to the upper and lower portions of the piezoelectric ceramic body 2. External electrodes 14 and 15 are located on both side surfaces of this structure. The external electrode 14 is electrically connected to the signal drawing electrode which is located on the upper surface of the piezoelectric body 2, i.e., the first surface electrode 3. On the other hand, the external electrode 15 is electrically connected to the signal drawing electrode which is located on the lower surface of the piezoelectric ceramic body 2, i.e., the third surface electrode 9.

When this piezoelectric element 1 is provided in an acceleration sensor, the piezoelectric element 1 functions as described below. When acceleration acts on the piezoelectric element 1, respective central portions of the piezoelectric ceramic body regions 2A and 2B forming the piezoelectric ceramic body 2, i.e., the second portions, and the first and third portions are deformed in opposite directions by inertial force. In this case, the second portions and the first and third portions are subjected to a tensile force or a compressive stress resulting from the aforementioned deformation. When the central second portions are subjected to tensile stress, for example, the first and third portions are subjected to compressive stress. Because the second portions and the first and third portions are polarized in opposite directions, the quantity of electric charges generated in the entire piezoelectric ceramic body 2 is greatly increased by electric charges generated by the stress in the second portions and the first and third portions. Thus, it is possible to form an acceleration sensor having excellent detection sensitivity.

A method of manufacturing the piezoelectric element 1 shown in FIG. 1 is now described with reference to FIGS. 2A to 2C and 3A and 3B. This method is adapted to form the piezoelectric element 1 shown in FIG. 1 from a mother piezoelectric ceramic body material. Areas corresponding to individual piezoelectric elements are divided by phantom lines X, Y and Z in FIGS. 2A to 2C and 3A and 3B.

First, a mother piezoelectric ceramic body 16 which is in the form of an elongated plate is prepared as shown in FIG. 2A. Internal electrodes 11 are formed in the piezoelectric ceramic body 16 at an intermediate vertical position, to extend in the longitudinal direction. While a plurality of internal electrodes 11 are formed in FIG. 2A, one internal electrode 11 is provided in the resulting piezoelectric element 1 shown in FIG. 1.

The mother piezoelectric ceramic body 16 is divided into upper and lower piezoelectric ceramic body regions 16A and 16B through the portion provided with the aforementioned internal electrodes 11.

On an upper surface of the piezoelectric ceramic body 16, a plurality of sets of first to third surface electrodes 3 to 5 are formed so as to extend longitudinally along the piezoelectric ceramic body 16.

On a lower surface of the piezoelectric ceramic body 16, a plurality of sets of first to third surface electrodes 7 to 9 are similarly formed so as to extend in the longitudinal direction. The first to third surface electrodes 3 to 5 and 7 to 9 are formed to be positioned in the aforementioned first to third portions, respectively.

Then, polarization is carried out through the internal electrodes 11 and the first to third surface electrodes 3 to 5 and 7 to 9. Namely, relatively high voltages, relatively low voltages, and intermediate voltages are applied to the second surface electrodes 4 and 8, the first and third surface electrodes 3, 5, 7 and 9, and the internal electrodes 11, respectively, thereby polarizing the respective piezoelectric ceramic body regions 16A and 16B as shown by arrows A to C and D to F in FIG. 2B.

Then, first and second connecting electrodes 6 and 10 are located on the first to third surface electrodes 3 to 5 and 7 to 9, respectively in the individual piezoelectric element portions, as shown in FIG. 2C.

Then, mother frame bodies 17 and 18 are connected to and integrated with upper and lower portions of the piezoelectric ceramic body 16, respectively by adhesives, as shown in FIG. 3A. Further, the structure shown in FIG. 3A is cut along two-dot chain lines X, Y and Z to obtain individual piezoelectric elements 1, thereby obtaining a structural body 19 shown in FIG. 3B. The signal drawing electrode which is located on the upper surface of the piezoelectric ceramic body 2, i.e., the first surface electrode 3, is exposed on a first side surface of the structural body 19 obtained in the aforementioned manner. Similarly, an end of another signal drawing electrode, i.e., the third surface electrode 9, is exposed on a second side surface of the piezoelectric ceramic body 2. The external electrodes 14 and 15 shown in FIG. 1 are formed on these side surfaces, so that the respective signal drawing electrodes are electrically connected with the external electrodes 14 and 15 for obtaining the piezoelectric element 1.

However, the aforementioned method of manufacturing the piezoelectric element 1 has the following problems. The thicknesses of the first to third mother surface electrodes 3 to 5 and 7 to 9 which are formed on the upper and lower surfaces of the mother piezoelectric ceramic body 16 may be reduced depending on the forming conditions. The reduced thicknesses of the surface electrodes 3 to 5 and 7 to 9 may destroy the electrical connection between the external electrodes 14 and 15 and the surface electrodes 3 and 9, i.e., the electrical connection between the external electrodes 14 and 15 and the respective signal drawing electrodes.

In addition, when the connecting electrodes 6 and 10 are formed by screen-printing conductive paste and baking the paste depolarization is caused in the piezoelectric ceramic body 16 by heat which is applied during baking. When slight depolarization is caused, detection sensitivity is reduced in the resulting acceleration sensor. Thus, the non-defective rate as and mass productivity of the acceleration sensor are disadvantageously reduced by the conventional method.

SUMMARY OF THE INVENTION

In order to solve the aforementioned problems of the piezoelectric element and the method of manufacturing the same piezoelectric element, an object of the present invention is to provide a piezoelectric element and a method of manufacturing a piezoelectric element to provide a secure electrical connection between a signal drawing electrode provided thereon and an external electrode without causing depolarization in a piezoelectric ceramic body.

According to a first aspect of a preferred embodiment of the present invention, a piezoelectric element includes a piezoelectric body having first to third portions extending along a longitudinal direction so that the first and third portions and the second portion are oppositely polarized along the thickness direction, an internal electrode located in the interior of the piezoelectric body so as to extend in the longitudinal direction without extending to the longitudinal ends, and first and second signal drawing electrodes located on upper and lower surfaces of the piezoelectric body, respectively. The first and second signal drawing electrodes have first to third surface electrodes including thick films which are formed on the first to third portions, respectively, to be separated from each other along the longitudinal direction, and connecting electrodes including thin films which are formed to electrically connect the first to third surface electrodes with each other while at least partially covering the first to third surface electrodes.

The connecting electrodes can be formed so as to not extend to both longitudinal ends of the piezoelectric body. The piezoelectric body is preferably made of piezoelectric ceramics.

According to a second aspect of a preferred embodiment of the present invention, the aforementioned piezoelectric element can be manufactured by a method including the steps of preparing a piezoelectric body having an internal electrode located in an interior of the piezoelectric body so as to extend along its a longitudinal direction, applying conductive paste to upper and lower surfaces of the piezoelectric body in first to third portions of the piezoelectric body along the longitudinal direction and baking the piezoelectric body to form first to third surface electrodes, respectively, polarizing the piezoelectric body through the internal electrode and the first to third surface electrodes provided on the upper and lower surfaces of the piezoelectric body, respectively, so that the first and third portions and the second portion of the piezoelectric body are oppositely polarized along a thickness direction, and forming first and second connecting electrodes for electrically connecting the first to third surface electrodes which are formed on the upper and lower surfaces of the piezoelectric body, respectively, with each other, to at least partially cover the first to third surface electrodes, respectively. In this case, the step of preparing the piezoelectric body provided with the internal electrode may be carried out by connecting a pair of piezoelectric ceramic plates to each other so that the internal electrode is located therebetween, for example.

According to a third aspect of a preferred embodiment of the present invention, the aforementioned piezoelectric element can be manufactured through steps of preparing a pair of piezoelectric ceramic plates, forming internal electrodes on single major surfaces of the respective piezoelectric ceramic plates so that the internal electrodes extend in longitudinal directions thereof but not to extend to both longitudinal ends, forming first to third surface electrodes by locating thick films in first to third portions along the longitudinal directions on surfaces of the piezoelectric ceramic plates which are opposite to first to third portions provided with the internal electrodes by application and baking of conductive paste, respectively, polarizing the respective piezoelectric ceramic plates provided with the internal electrodes and the first to third surface electrodes so that the first and third portions and the second portions are oppositely polarized along thickness directions through the internal electrodes and the first to third surface electrodes, forming connecting electrodes by locating thin films on the surfaces of the respective piezoelectric ceramic plates provided with the first to third surface electrodes for electrically connecting the first to third surface electrodes with each other while at least partially covering the first to third surface electrodes, and connecting the surfaces that are provided with the internal electrodes and the surfaces of the pair of piezoelectric ceramic plates provided with the connecting electrodes with each other for forming a piezoelectric body.

In the piezoelectric element according to a fourth aspect of a preferred embodiment of the present invention and the method of manufacturing the piezoelectric element, the first to third surface electrodes defining the signal drawing electrodes are formed as thin films. Therefore, it is possible to stabilize electrical connection states of the surface electrodes and external electrodes which are formed on outer surfaces of the piezoelectric element. Further, the connecting electrodes are formed as thin films by sputtering for electrically connecting the first to third surface electrodes with each other while at least partially covering the first to third surface electrodes, whereby no depolarization of the piezoelectric body is caused during formation of the electrodes. Namely, the temperature of the piezoelectric body is suppressed below a Curie point during formation of the electrodes by sputtering, whereby the piezoelectric body is hardly depolarized. In an acceleration sensor which is formed by the inventive piezoelectric element, therefore, it is possible to improve detection sensitivity and mass productivity of the acceleration sensor.

According to a fifth aspect of the present invention, a piezoelectric element is provided by comprises a piezoelectric body having first to third portions extending along a longitudinal direction, the piezoelectric body being polarized that the first and third portions and the second portion are oppositely polarized along the thickness direction, first to third internal electrodes which are located in the piezoelectric body so as to longitudinally extend in the first to third portions, respectively, while being separated from each other, and first and second signal drawing electrodes which are located on upper and lower surfaces of the piezoelectric body, respectively.

The piezoelectric body is preferably made of piezoelectric ceramics.

The piezoelectric element can be manufactured by the following at least a first or a second method, for example.

The first method preferably comprises steps of preparing first and second rectangular plate type green sheets containing piezoelectric ceramics, applying conductive paste to first to third portions of the first green sheet along a longitudinal direction on one surface thereof for forming first to third internal electrode patterns, respectively, stacking the second green sheet on the surface of the first green sheet provided with the first to third internal electrode patterns for obtaining a laminate sheet, firing the laminate sheet thereby integrally firing the ceramics and the first to third internal electrodes for obtaining a sintered body, applying conductive paste to upper and lower surfaces of the sintered body and baking the sintered body thereby forming first and second signal drawing electrodes, respectively, and polarizing the sintered body through the first and second signal drawing electrodes and the first to third internal electrodes so that the first and third portions and the second portion along the longitudinal direction of the sintered body are oppositely polarized in the thickness direction.

On the other hand, the second method preferably comprises the steps of preparing first and second piezoelectric ceramic plates in the form of fired rectangular plates, applying conductive paste to first to third portions along longitudinal directions on single surfaces of the first and second piezoelectric ceramic plates, respectively, for forming first to third internal electrode patterns, applying conductive paste to surfaces of the first and second piezoelectric ceramic plates opposite to those provided with the internal electrode patterns for forming first and second signal drawing electrode patterns, respectively, heating the first and second piezoelectric ceramic plates thereby baking the internal electrode patterns and the signal drawing electrode patterns for forming first to third internal electrodes and signal drawing electrodes, polarizing the first and second piezoelectric ceramic plates through the signal drawing electrodes and the first to third internal electrodes so that the first and third portions and the second portions of the piezoelectric ceramic plates are oppositely polarized in thickness directions thereof, and bonding the surfaces, provided with the internal electrodes, of the first and second piezoelectric ceramic plates provided with the first to third internal electrodes to each other thereby obtaining a piezoelectric element.

The piezoelectric element according to the preferred embodiments of the present invention is may be used in an acceleration sensor, for example. According to the present invention, therefore, an acceleration sensor including the aforementioned preferred embodiment of the piezoelectric element is provided.

In the piezoelectric element according to wide a sixth aspect of a preferred embodiment of the present invention and the method of manufacturing the piezoelectric component, the first to third internal electrodes are located in the piezoelectric body and the first and second signal drawing electrodes are arranged on outer surfaces, while the first to third portions are polarized through the first to third internal electrodes and the signal drawing electrodes. Therefore, it is not necessary to form a plurality of surface electrodes which are separated from each other on the upper and lower surfaces of the piezoelectric body, and to execute polarization through such separated first to third surface electrodes. Further, it is not necessary to form connecting electrodes after completion of polarization, and hence it is not necessary to located the signal drawing electrodes in two-layer structures either. Consequently, the step of forming the electrodes on the upper and lower surfaces of the piezoelectric body can be simplified. While depolarization may result from heating when signal drawing electrodes of two-layer structures are formed by baking conductive paste, such depolarization is not caused in the piezoelectric element according to at least one of the preferred embodiments of the present invention and the method of manufacturing the piezoelectric element.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
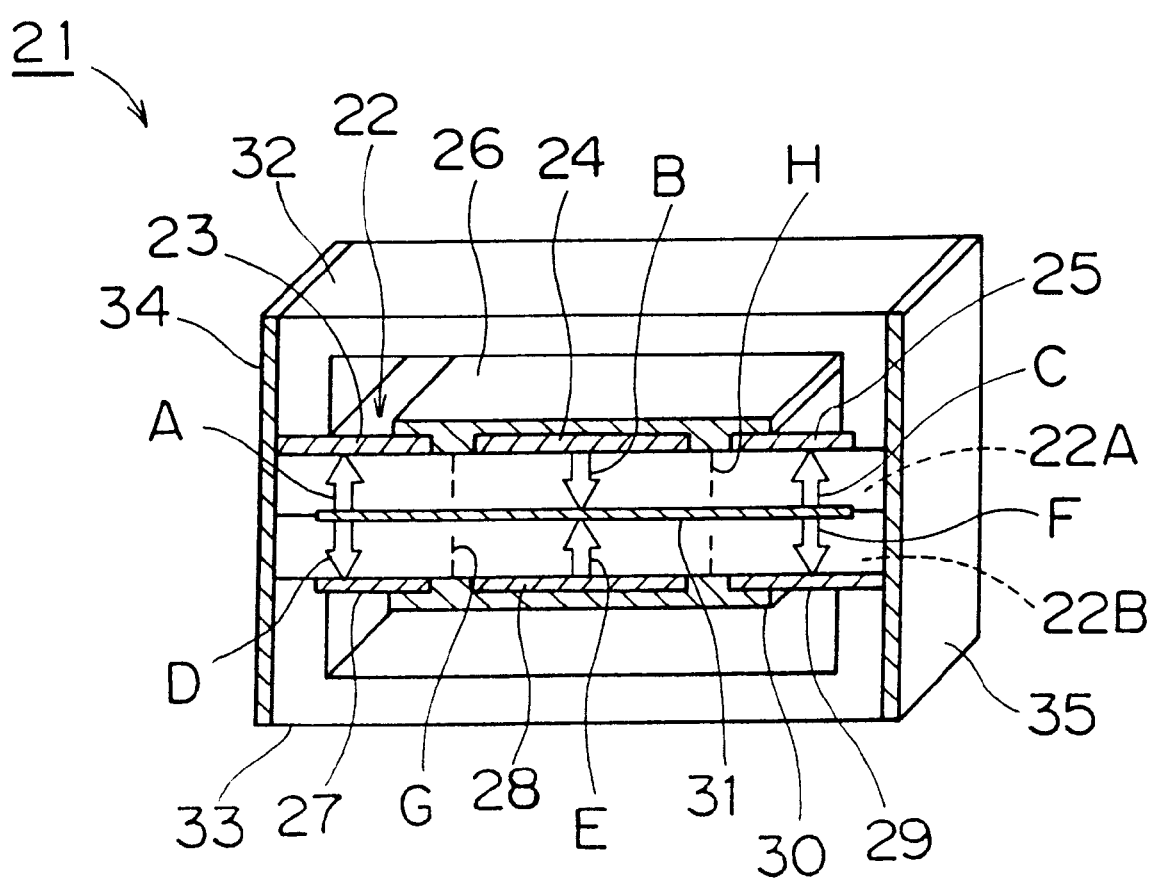
FIG. 4 is a perspective view showing a piezoelectric element according to a first preferred embodiment of the present invention.

FIG. 4 is a perspective view for illustrating a piezoelectric element 21 according to a first preferred embodiment of the present invention.

The piezoelectric element 21 includes a rectangular plate type piezoelectric ceramic body 22. First to third surface electrodes 23, 24 and 25 are formed on an upper surface of the piezoelectric ceramic body 2. The first to third surface electrodes 23 to 25 are formed at positions similar to those of the first to third surface electrodes 3 to 5 of the conventional piezoelectric element 1 shown in FIG. 1. On a lower surface of the piezoelectric body 22, first to third surface electrodes 27 to 29 are formed so as to be separated from each other. The first to third surface electrodes 27 to 29 are formed at positions similar to those of the first to third surface electrodes 7 to 9 of the conventional piezoelectric element 1 shown in FIG. 1. According to this preferred embodiment, all of the first to third surface electrodes 23 to 25 and 27 to 29 are preferably formed as thick films by applying and baking conductive paste. In this point, the first to third surface electrodes 23 to 25 and 27 to 29 are different from the surface electrodes 3 to 5 and 7 to 9 shown in FIG. 1.

According to this preferred embodiment, a connecting electrode 26 is formed on the upper surface of the piezoelectric ceramic body 22, to connect the first to third surface electrodes 23 to 25 with each other while at least partially covering the first to third surface electrodes 23 to 25. A signal drawing electrode is formed by the connecting electrode 26 and the first to third surface electrodes 23 to 25. Similarly, another connecting electrode 30 is also formed on the lower surface of the piezoelectric ceramic body 22, to electrically connect the first to third surface electrodes 27 to 29 with each other. A lower signal drawing electrode is formed by the connecting electrode 30 and the surface electrodes 27 to 29.

Figure 1:
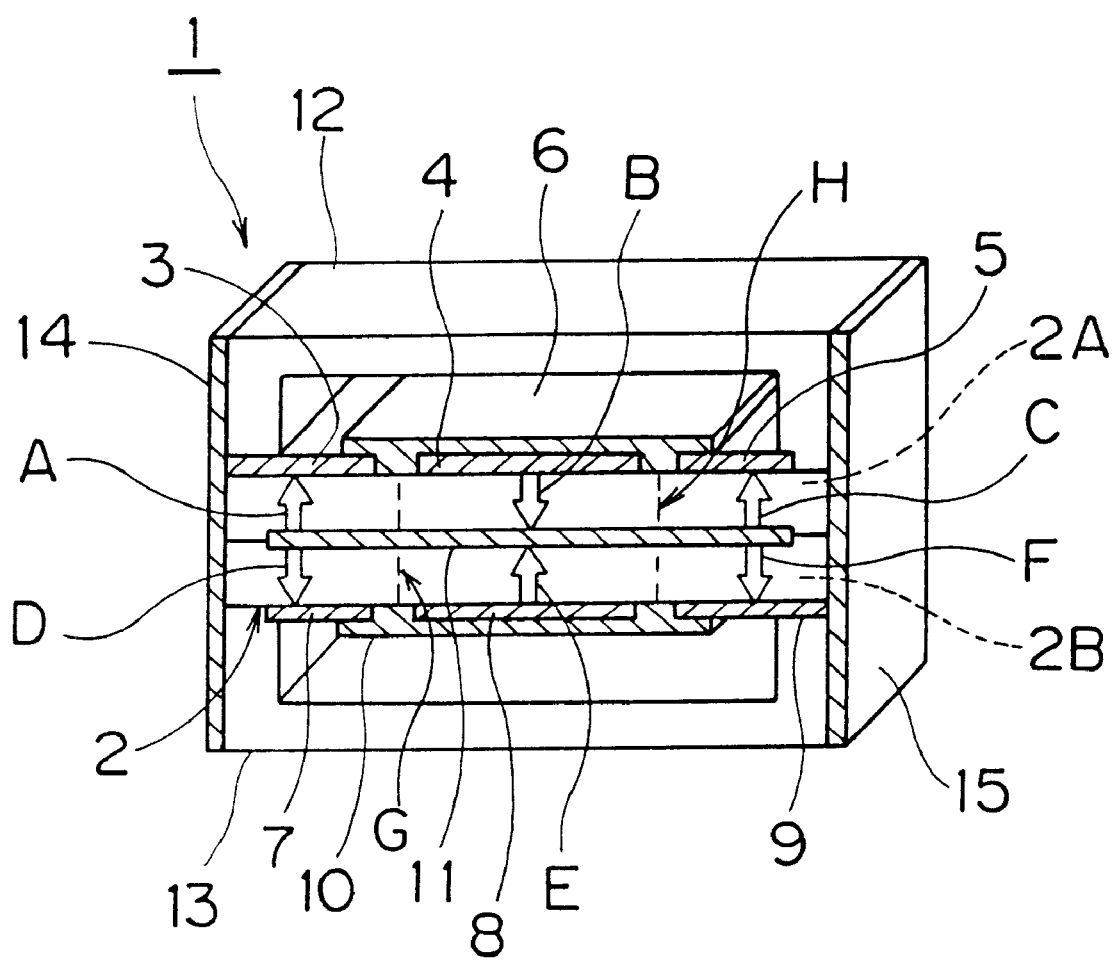
FIG. 1 is a perspective view schematically illustrating the structure of a conventional piezoelectric element.

Therefore, the connecting electrodes 26 and 30 have functions which are substantially similar to those of the connecting electrodes 6 and 10 provided in the piezoelectric element 1 shown in FIG. 1. According to this preferred embodiment, however, the connecting electrodes 26 and 30 are formed as thin films by a thin film forming method such as sputtering, unlike the connecting electrodes 6 and 10 shown in FIG. 1.

In other respects, the piezoelectric element 21 is similar to the piezoelectric element 1 shown in FIG. 1. Namely, the first to third surface electrodes 23 to 25 and 27 to 29 are formed in first to third portions along the longitudinal direction of the piezoelectric ceramic body 22, respectively. The first to third portions of the piezoelectric ceramic body 22 are divided by boundaries G and H. Namely, the first to third portions are located on the left side of the boundary G, between the boundaries G and H, and on the right side of the boundary H, respectively. Further, a longitudinally internal electrode 31 is formed in the piezoelectric ceramic body 22. This internal electrode 31 is formed to extend in the longitudinal direction, but not to extend to both longitudinal ends. Thus, the internal electrode 31 is not exposed on either of the end surfaces of the piezoelectric ceramic body 22. Further, the piezoelectric ceramic body 22 is polarized in the first to third portions, as shown by arrows A to C and D to F in FIG. 4. In addition, piezoelectric ceramic body regions 22A and 22B which are located above and under the internal electrode 11, respectively, are polarized in opposite directions in each of the first to third portions. In each of the piezoelectric ceramic body regions 22A and 22B, further, the second portion and the first and third portions are polarized in opposite directions.

Frame bodies 32 and 33 are fixed to upper and lower portions of the piezoelectric ceramic body 22, respectively. These frame bodies 32 and 33 are preferably made of insulating ceramics such as alumina or an insulating material such as synthetic resin. Each of the frame bodies 32 and 33 has a flat plate portion and a pair of fixed portions extending from both ends of the flat plate portion toward the piezoelectric ceramic body 22. Each of the frame bodies 32 and 33 is preferably bonded to the upper or lower surface of the piezoelectric ceramic body 22 at the pair of fixed portions.

In the piezoelectric element 21, external electrodes 34 and 35 are formed on both side surfaces of a structural body which is formed by fixing the frame bodies 32 and 33 to the upper and lower portions of the piezoelectric ceramic body 22, respectively.

In the piezoelectric element 21, the signal drawing electrode which is formed on the upper surface of the piezoelectric ceramic body 2 is electrically connected with the external electrode 34 at the surface electrode 23. Similarly, the third surface electrode 29 is electrically connected with the external electrode 35 in the signal drawing electrode which is formed on the lower surface. In this case, the electrical connection states between the surface electrodes 23 and 29 and the external electrodes 34 and 35 are reliably maintained since the surface electrodes 23 and 29 are formed by thick films as described above.

The piezoelectric element 21 can be applied to an acceleration sensor in the state shown in FIG. 4, for example. The piezoelectric element 21 can alternatively be mounted on a substrate (not shown) or a case (not shown) for forming a component which is provided in an acceleration sensor.

A method of manufacturing a preferred embodiment of piezoelectric element 21 shown in FIG. 4 is now described with reference to FIGS. 2A to 2C and 3A and 3B, which have been employed for illustrating the conventional method.

While reference numerals appearing in FIGS. 2A to 2C and 3A and 3B correspond to the respective parts of the piezoelectric element 1 shown in FIG. 1, the piezoelectric element 21 according to the preferred embodiment shown in FIG. 4, which is similar in structure to the piezoelectric element 1 except the signal drawing electrodes, is described with reference to these figures.

In order to manufacture the piezoelectric element 21 according to this first preferred embodiment, a mother piezoelectric ceramic body is first prepared from piezoelectric ceramics such as lead zirconate titanate piezoelectric ceramics. This piezoelectric ceramic body is prepared similarly to the piezoelectric ceramic body 16 shown in FIG. 2A, so that a plurality of strip internal electrodes are formed therein. Such a piezoelectric ceramic body may be obtained by a method of printing the internal electrodes on one surface of a mother green sheet, stacking another mother green sheet thereon and firing the stacked green sheets, or a method of forming the internal electrodes on a first previously fired mother piezoelectric ceramic plate and joining a second fired piezoelectric ceramic plate the first mother piezoelectric ceramic plate.

Further, conductive paste containing silver or silver-palladium alloy powder is prepared for forming first to third surface electrodes on upper and lower surfaces of the mother piezoelectric ceramic body. The first to third surface electrodes are preferably formed in substantially the same positions as the first to third surface electrodes 3 to 5 and 7 to 9 of the conventional piezoelectric element 1 shown in FIG. 2B.

The surface electrodes of the conductive paste can be formed by applying the conductive paste, drying the paste, and thereafter baking the paste at a temperature of about 800° C. Thus, the first to third surface electrodes 23 to 25 and 27 to 29 of thick films having thicknesses of about 3 to 10 µm are formed in this preferred embodiment. The lead zirconate titanate piezoelectric ceramics has a Curie point of about 300° C. However, no polarization is performed in advance of the step of forming the surface electrodes 23 to 25 and 27 to 29. Therefore, no depolarization is caused by such formation of the surface electrodes 23 to 25 and 27 to 29.

Then, the mother piezoelectric ceramic body is polarized through the internal electrodes and the first to third surface electrodes. In this case, the polarization can be performed by applying relatively high voltages, relatively low voltages, and intermediate voltages to the second surface electrodes provided in the second portions, the first and third surface electrodes provided in the first and third portions, and the internal electrodes, respectively. Thus, the mother piezoelectric ceramic body can be polarized similarly to the piezoelectric ceramic body 16 shown in FIG. 2B, which is polarized as shown by arrows A to C and D to F.

Figure 2A:
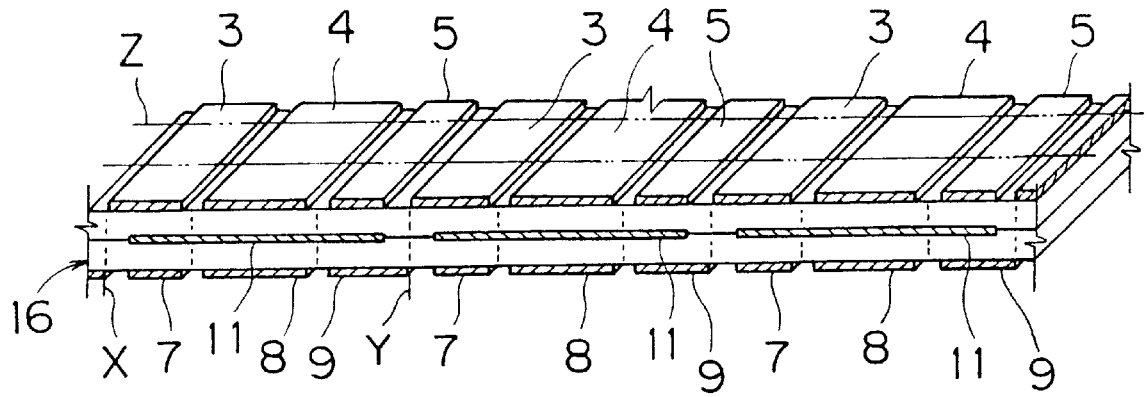
FIGS. 2A to 2C are perspective views for illustrating a method of manufacturing the conventional piezoelectric element, showing a mother piezoelectric ceramic body in a state provided with first to third surface electrodes on upper and lower surfaces, respectively, in a polarized state, and in a state provided with connecting electrodes, respectively.
Figure 2B:
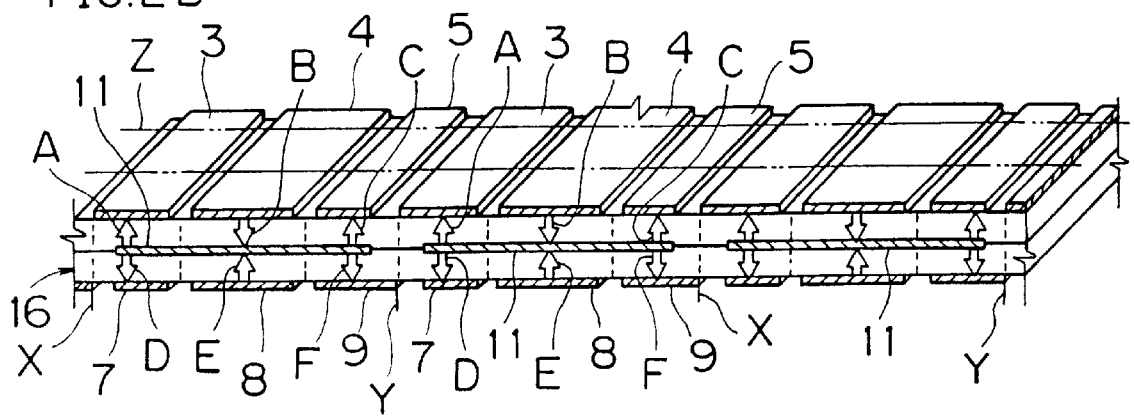
Figure 2C:
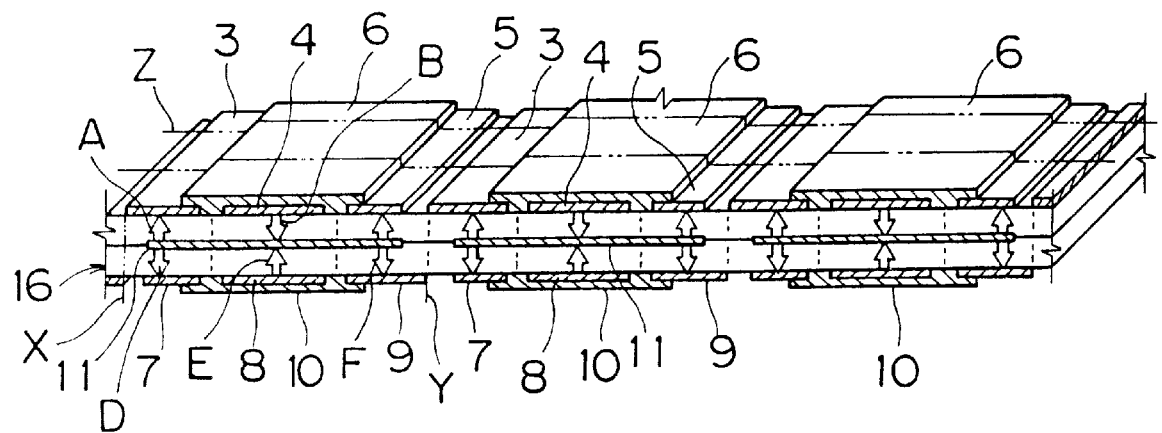
Figure 3A:
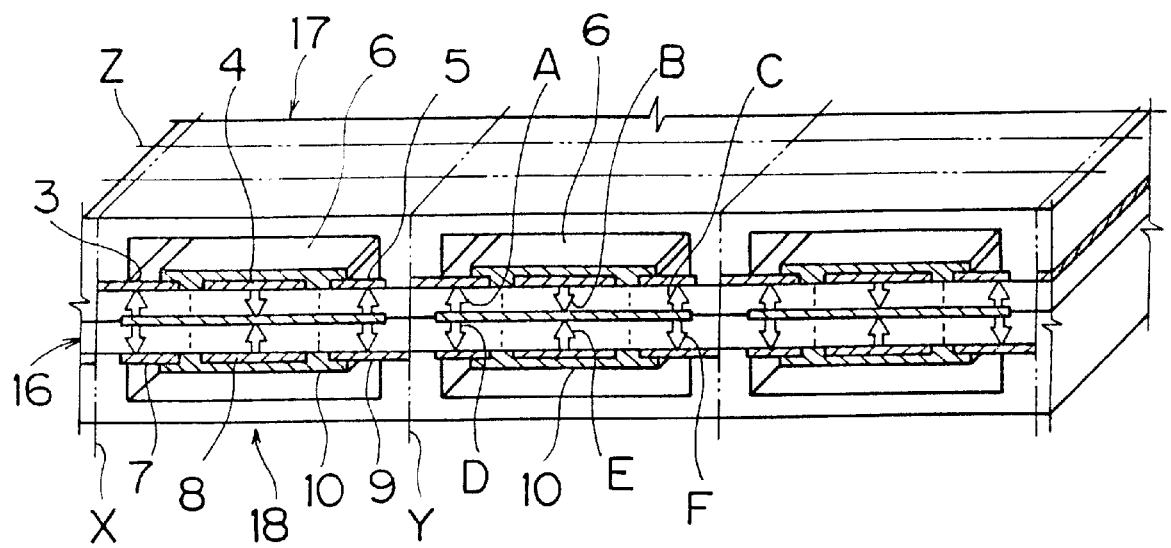
FIGS. 3A and 3B, are perspective views illustrating the method of manufacturing of the conventional piezoelectric element, including a mother structural body, and illustrating the structure of an individual piezoelectric element obtained by cutting the mother structural body shown in FIG. 3A respectively.
Figure 3B:
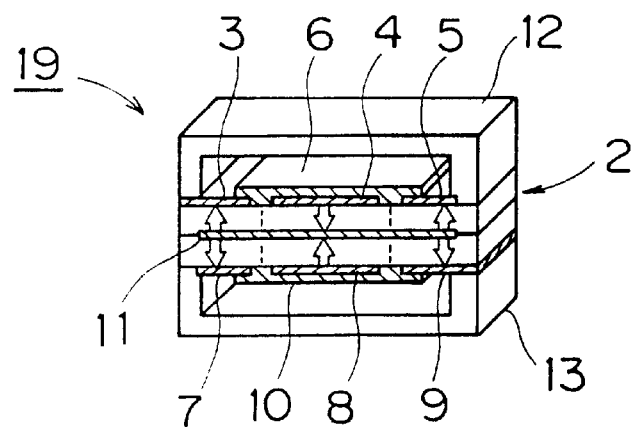

Then, connecting electrodes are formed on upper and lower surfaces of the mother piezoelectric ceramic body, respectively, in positions similar to those of the connecting electrodes 6 and 10 shown in FIG. 2C. According to this preferred embodiment, however, the connecting electrodes are preferably formed by sputtering. Namely, the connecting electrodes are preferably formed by sputtering Monel, for example, on the upper and lower surfaces of the piezoelectric ceramic body, to cover the first to third surface electrodes. These connecting electrodes finally define the connecting electrodes 26 and 30 shown in FIG. 4.

The metal material for forming the connecting electrodes is not restricted to the Monel, which is a nickel-copper alloy, but may alternatively be prepared from nickel or silver. The temperature of the piezoelectric ceramic body is about 100 to 200° C. in the aforementioned sputtering. Thus, the temperature of the piezoelectric ceramic body in the sputtering is lower than the Curie point of the lead zirconate titanate piezoelectric ceramics forming the piezoelectric ceramic body, to result in no depolarization.

Then, after signal drawing electrodes are defined by forming the first to third surface electrodes and the connecting electrodes on the upper and lower surfaces of the mother piezoelectric ceramic body, respectively, in the aforementioned manner, mother frame bodies are fixed. The mother frame bodies can be formed to have substantially the same structures as the frame bodies 17 and 18 shown in FIG. 3D. Further, structural bodies for individual piezoelectric elements can be obtained by cutting a mother structural body obtained in the aforementioned manner along lines corresponding to the phantom lines X, Y and Z shown in FIG. 3A. Each structural body obtained in this manner corresponds to a structure, which is not yet provided with the external electrodes 34 and 35, in the piezoelectric element 21 shown in FIG. 4.

Then, the piezoelectric element 21 can be obtained by forming the external electrodes 34 and 35 shown in FIG. 4 by a thin film forming method such as sputtering or plating.

In the piezoelectric element 21, the surface electrodes 23 and 29 are preferably formed of thick films, whereby electrical connection states between the surface electrodes 23 and 29 and the external electrodes 34 and 35 can be stabilized.

While the rectangular plate type mother piezoelectric ceramic body having previously embedded internal electrodes is employed in the aforementioned method, the piezoelectric element 21 according to the first preferred embodiment can also be manufactured by the method described in the following paragraph.

Figure 5A:
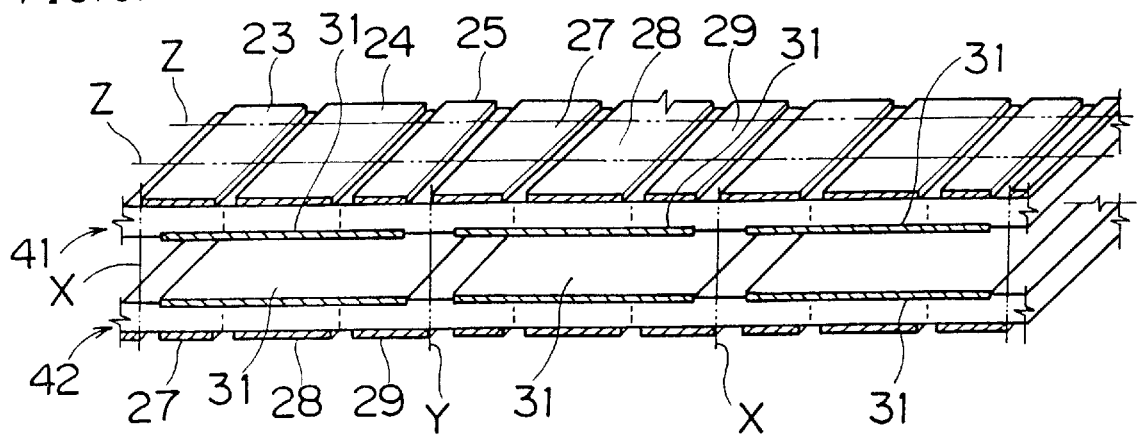
FIGS. 5A to 5C, which are adapted to illustrate exemplary a preferred method of manufacturing a piezoelectric element according to a preferred embodiment of the present invention, are a perspective view showing a pair of piezoelectric substrates provided with internal electrodes and first to third surface electrodes, an exploded perspective view showing the first and second piezoelectric substrates in polarized states, and a perspective view showing the first and second piezoelectric substrates provided with connecting electrodes.

First, a first mother piezoelectric ceramic plate 41 which is provided with a plurality of mother internal electrodes 31 on one surface and a second mother piezoelectric ceramic plate 42 which is also provided with mother internal electrodes 31 on one surface are prepared as shown in FIG. 5A. First to third surface electrodes 23 to 25 and 27 to 29 are preferably formed of conductive paste containing silver or silver-palladium on surfaces of the piezoelectric ceramic plates 41 and 42 which are opposite to those provided with the internal electrodes 31, respectively. These surface electrodes 23 to 25 and 27 to 29 are preferably formed by printing and baking the conductive paste, while the conductive paste preferably baked by heating the same to a temperature of about 800° C., similarly to the aforementioned method.

The first to third surface electrodes 23 to 25 and 27 to 29 are formed to be located at portions corresponding to first to third portions of piezoelectric ceramic bodies for forming individual piezoelectric elements, respectively.

Figure 5B:
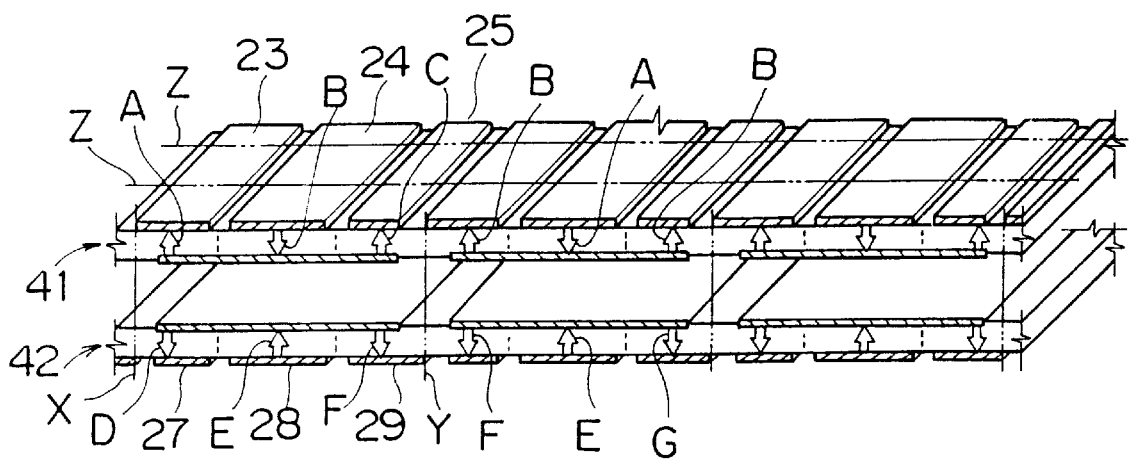
Figure 5C:
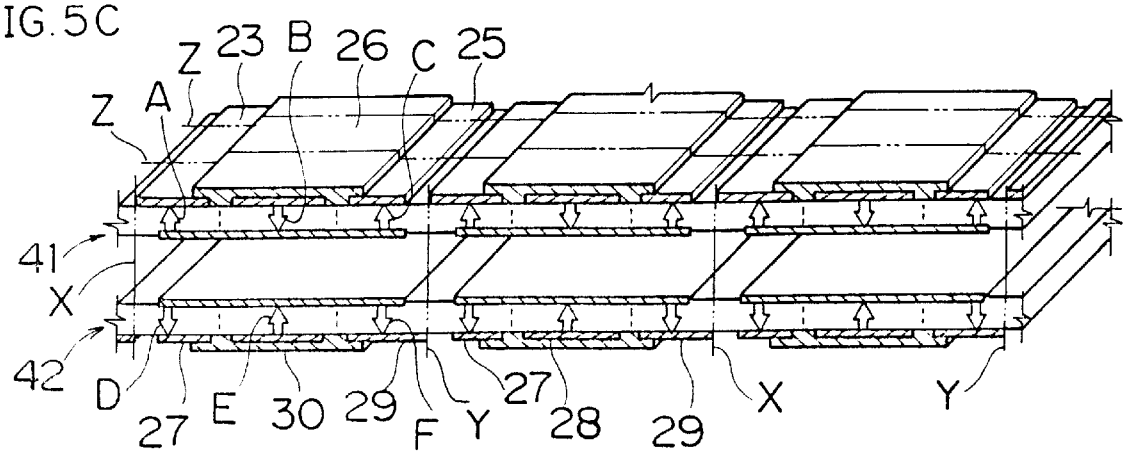

Then, the internal electrodes 31 and the surface electrodes 23 to 25 and 27 to 29 are employed to polarize the first and second piezoelectric ceramic plates 41 and 42, respectively. This polarization is performed by applying relatively high voltages, relatively low voltages, and intermediate voltages to the second surface electrodes 24, the first and third surface electrodes 23 and 25, and the internal electrodes 31 in the piezoelectric ceramic plate 41, respectively, as shown in FIG. 5B, whereby the second portions are polarized along arrows B and the first and third portions are polarized along arrows A and C, respectively, in the piezoelectric ceramic plate 41. Similarly, the second portions are polarized along arrows E and the first and third portions are polarized along arrows F and G, respectively, in the second ceramic plate 42.

Then, connecting electrodes 26 and 30 are formed preferably by sputtering.

Thereafter, the first and second mother piezoelectric plates 41 and 42 are pasted to each other so that the internal electrodes 31 thereof overlap with each other. The mother ceramic plates 41 and 42 can be pasted to each other through an adhesive to obtain a structure which is similar to that of the piezoelectric element 21 according to the embodiment shown in FIG. 4, and the piezoelectric element 21 can be obtained by forming the external electrodes 34 and 35 (see FIG. 4) by a suitable method.

In the piezoelectric element 21 according to the first preferred embodiment, as hereinabove described, the first to third surface electrodes 23 to 25 and 27 to 29 are preferably formed by thick films, whereby electrical connection between the external electrodes 34 and 35 and the first and third surface electrodes 23 and 29 can be ensured. In the manufacturing steps, further, the polarization is performed after formation of the first to third surface electrodes 23 to 25 and 27 to 29 formed of thick films in advance of formation of the connecting electrodes 26 and 30 which are in the form of thin films. Therefore, the piezoelectric body is not heated to a temperature exceeding the Curie point after the polarization, to result in no depolarization.

Figure 6:
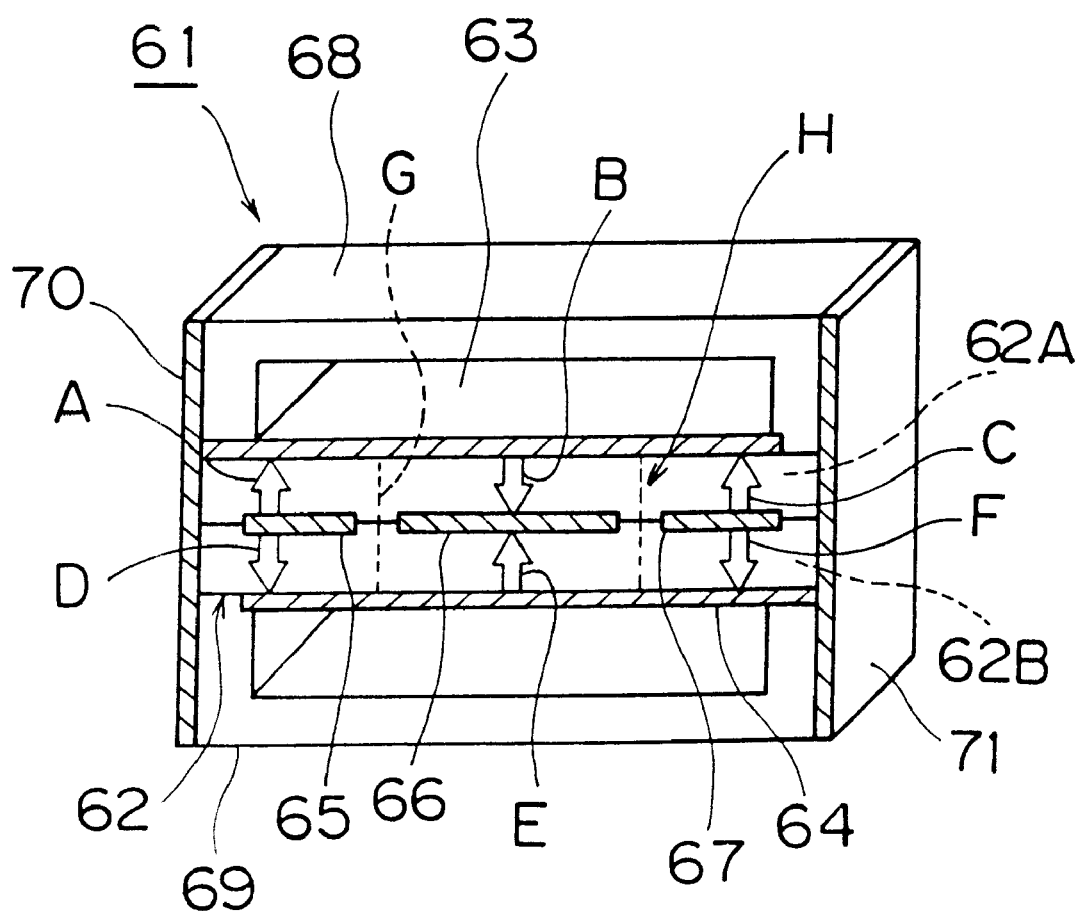
FIG. 6 is a perspective view showing a piezoelectric element according to a second preferred embodiment of the present invention.

FIG. 6 is a perspective view showing a piezoelectric element 61 according to a second preferred embodiment of the present invention.

The piezoelectric element 61 has a piezoelectric ceramic body 62 serving as a piezoelectric body. First and second signal drawing electrodes 63 and 64 are formed on upper and lower surfaces of the piezoelectric ceramic body, 62 respectively. The first signal drawing electrode 63 is so formed that one end thereof extends to one side edge of the piezoelectric ceramic body 62, while the second signal drawing electrode 64 is drawn out to a side edge which is opposite to that drawing out the signal drawing electrode 63.

In the interior of the piezoelectric ceramic body 62, first to third internal electrodes 65, 66 and 67 are formed at an intermediate vertical position. The first to third internal electrodes 65 to 67 are formed in first to third portions along the longitudinal direction of the piezoelectric ceramic body 62, respectively.

The first to third portions are divided by boundaries shown by broken lines G and H, respectively. In other words, the first, second and third portions of the piezoelectric ceramic body 62 are located on the left side of the boundary G, between the boundaries G and H, and on the right side of the boundary H, respectively.

The piezoelectric ceramic body 62 is polarized as shown by arrows A to F in FIG. 6. In a piezoelectric ceramic body region 62A of the piezoelectric ceramic body 62 which is located above the portion provided with the internal electrodes 65 to 67, the second portion is polarized along arrow B, while the first and third portions are polarized along arrows A and C, respectively, oppositely to the second portion. Similarly in a piezoelectric body region 62B which is located under the portion provided with the internal electrodes 65 to 67, the second portion is polarized along arrow E, while the first and third portions are polarized along arrows D and F, respectively, oppositely to the second portion. Namely, the second portion and the first and third portions are polarized in opposite directions in each of the piezoelectric ceramic body regions 62A and 62B. In each of the first to third portions, further, the upper and lower piezoelectric ceramic body regions 62A and 62B are polarized in opposite directions.

The piezoelectric ceramic body 62 is polarized through the first and second signal drawing electrodes 63 and 64 and the first to third internal electrodes 65 to 67. As clearly understood from a manufacturing method described later, relatively high voltages, a relatively low voltage, and intermediate voltages are applied to the first and third internal electrodes 65 and 67, the second internal electrode 66, and the first and second signal drawing electrodes 63 and 64, respectively, whereby the piezoelectric ceramic body 62 is polarized along arrows A to F in FIG. 6. Since the first to third internal electrodes 65 to 67 are located at the intermediate vertical position of the piezoelectric ceramic body 62 and the first and second signal drawing electrodes 63 and 64 are formed on the upper and lower surfaces thereof, respectively, the piezoelectric ceramic body 62 can be polarized in the aforementioned manner after formation of these electrodes 63 to 67. Thus, no depolarization results from formation of the electrodes 63 to 67, which can be formed on the piezoelectric ceramic body 62 in advance of the polarization.

Frame bodies 68 and 69 are fixed to the upper and lower surfaces of the piezoelectric ceramic body 62, respectively. Each of the frame bodies 68 and 69 is made of insulating ceramics or synthetic resin, and has a flat plate portion and a pair of fixed portions which are provided on both ends of the flat plate portion. The frame bodies 68 and 69 are fixed to the piezoelectric ceramic body 62 at the pairs of fixed portions respectively, preferably by adhesives or the like.

In the piezoelectric element 61 according to this preferred embodiment, external electrodes 70 and 71 are formed on a pair of side surfaces of a structural body which is formed by bonding the frame bodies 68 and 69 to the piezoelectric ceramic body 62. The external electrodes 70 and 71 can be formed by a suitable electrode forming method. These external electrodes 70 and 71 are electrically connected to the first and second signal drawing electrodes 63 and 64, respectively.

The first and second signal drawing electrodes 63 and 64 are preferably formed by applying and baking conductive paste, as thick films. Thus, electrical connection states between the first and second signal drawing electrodes 63 and 64 and the external electrodes 70 and 71 are stably maintained.

Only the first and second signal drawing electrodes 63 and 64 formed of single layers are located on the upper and lower surfaces of the piezoelectric ceramic body 62. Therefore, a step of forming electrodes on the upper and lower surfaces of the piezoelectric ceramic body 62 can be simplified as compared with the first embodiment.

An exemplary method of manufacturing the piezoelectric element 61 is now described with reference to FIGS. 7A to 7C and 8A and 8B.

The following description is made of steps for obtaining individual piezoelectric elements 61 from a mother structural body.

Figure 7A:
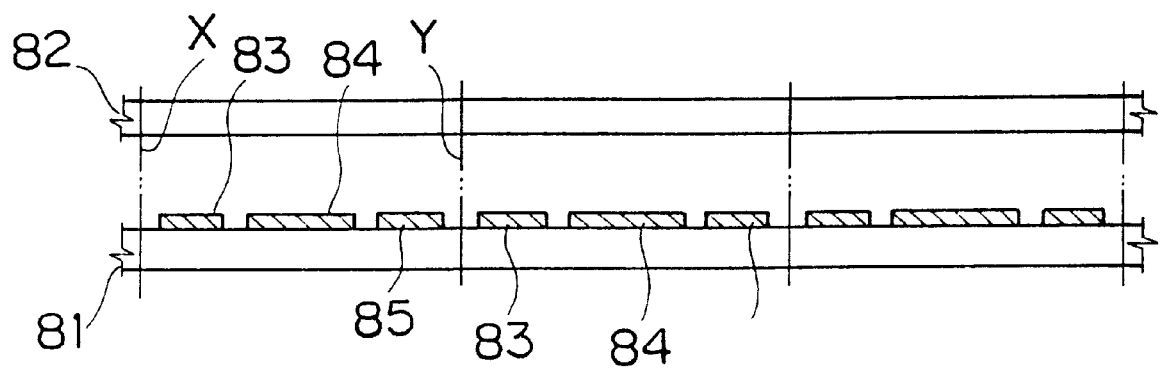
FIGS. 7A to 7C, which are adapted to illustrate a preferred method of manufacturing the piezoelectric element according to the second preferred embodiment, are side elevational views showing first and second piezoelectric bodies in states provided with first to third internal electrode patterns, a laminate obtained by stacking the first and second piezoelectric bodies with each other, and the laminate provided with first and second signal drawing electrodes on its upper and lower surfaces, respectively.

First, mother green sheets 81 and 82 for forming the piezoelectric ceramic body 62 are prepared as shown in FIG. 7A. The green sheets 81 and 82 are mainly made of lead zirconate titanate piezoelectric ceramic powder, respectively. These green sheets 81 and 82, which are prepared for forming a number of piezoelectric ceramic bodies 62, respectively, have shapes and sizes gathering the piezoelectric ceramic bodies 62 in the form of matrices. It is pointed out that a region corresponding to a single piezoelectric ceramic body 62 corresponds to a portion enclosed with phantom lines X and Y in FIG. 7A.

Conductive paste containing silver or silver-palladium alloy powder is preferably applied to an upper surface of the green sheet 81 by screen printing or the like and dried at a temperature of about 100° C., thereby forming first to third internal electrode patterns 83 to 85. The internal electrode patterns 83 to 85 extend in the form of strips, substantially perpendicularly to the plane of the figure.

Figure 7B:
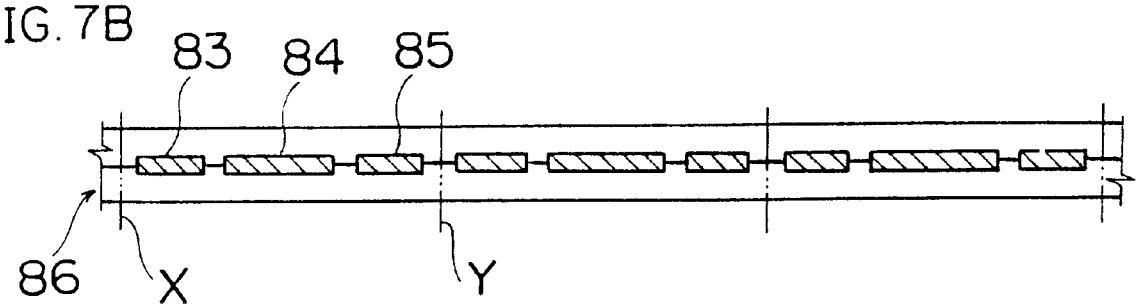

Then, the green sheet 82 is stacked on the green sheet 81 as shown in FIG. 7B, and fired at a temperature of about 1000° C. Due to this firing, the green sheets 81 and 82 are integrated with each other, to form a mother piezoelectric ceramic body 86. At the same time, the internal electrode patterns 83 to 85 are baked to form mother internal electrodes 83 to 85 (these reference numerals are identical to those for the internal electrode patterns).

Figure 7C:
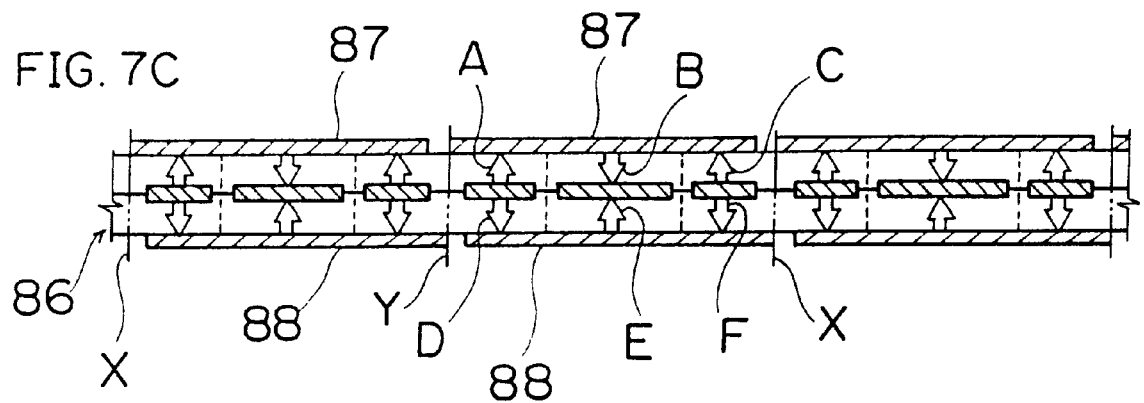

Then, first and second mother signal drawing electrodes 87 and 88 are formed on upper and lower surfaces of the mother piezoelectric ceramic body 86, respectively, as shown in FIG. 7C. The first and second signal drawing electrodes 87 and 88 are formed by applying conductive paste containing silver or silver-palladium alloy powder by screen printing or the like, drying the same at a temperature of about 100° C., and further baking the same at a temperature of about 800° C.

Then, the mother piezoelectric ceramic body 86 is polarized. This polarization is carried out by applying relatively high voltages, relatively low voltages, and intermediate voltages to the mother internal electrodes 83 and 85, the mother internal electrodes 84, and the first and second signal drawing electrodes 87 and 88, respectively. Consequently, the piezoelectric ceramic body 86 is polarized as shown by arrows A to F in FIG. 7C. Namely, longitudinally extending first to third portions of the piezoelectric ceramic body 86 are polarized similarly to the piezoelectric ceramic body 62 shown in FIG. 6 in the portions enclosed with the phantom lines X and Y.

Figure 8A:
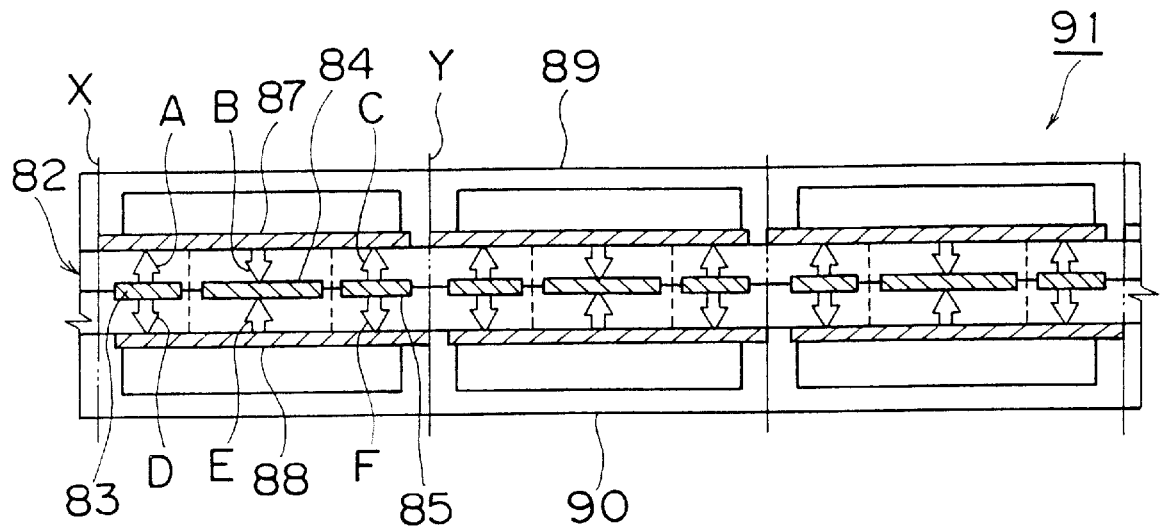
FIGS. 8A and 8B, which are adapted to illustrate a preferred method of manufacturing the piezoelectric element according to the second preferred embodiment, are a side elevational view showing mother frame bodies which are fixed to the piezoelectric ceramic bodies, and a structural body for an individual piezoelectric element which is cut out from a mother structural body.

Then, mother frame bodies 89 and 90 are fixed to upper and lower portions of the mother piezoelectric ceramic body 86, respectively, as shown in FIG. 8A. The mother frame bodies 89 and 90 are preferably made of insulating ceramics such as alumina or synthetic resin. These mother frame bodies 89 and 90 are preferably fixed to the mother piezoelectric ceramic body 86 through adhesives or the like.

Figure 8B:
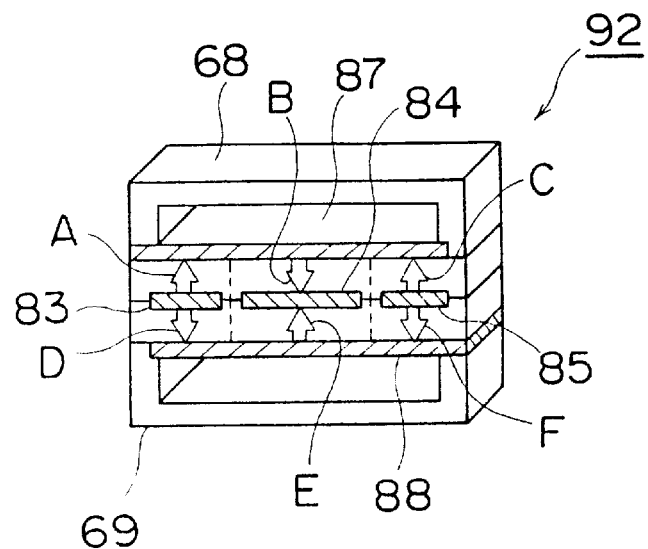

Then, a mother laminate 91 shown in FIG. 8A is cut along the phantom lines X and Y in FIG. 8A in its thickness direction, whereby a laminate 92 for an individual piezoelectric element shown in FIG. 8B can be obtained. In the laminate 92 for the individual piezoelectric element, the aforementioned mother piezoelectric ceramic body 86 is cut into the piezoelectric ceramic body 62. Similarly, the mother internal electrodes 83 to 85 are cut into the first to third internal electrodes 65 to 67, respectively, while the first and second mother signal drawing electrodes 87 and 88 are cut into the first and second signal drawing electrodes 63 and 64, respectively. In addition, the mother frame bodies 89 and 90 are cut into the frame bodies 68 and 69, respectively.

The piezoelectric element 61 shown in FIG. 6 can be obtained by forming the external electrodes 70 and 71 on a pair of side surfaces of the aforementioned laminate 92, respectively.

The piezoelectric element 61 obtained in the aforementioned manner can be employed as an acceleration sensor, for example, similarly to the first preferred embodiment. Namely, the piezoelectric element 61 can be applied to an acceleration sensor as such, while it is alternatively possible to form the piezoelectric element 61 as an acceleration sensor component by mounting the element 61 on a proper substrate or storing the same in a case.

Another exemplary method of manufacturing the piezoelectric element 61 is now described with reference to FIGS. 9A to 9C.

The piezoelectric element 61 can be manufactured not only by the aforementioned method, but by the method described in the following paragraph.

Figure 9A:
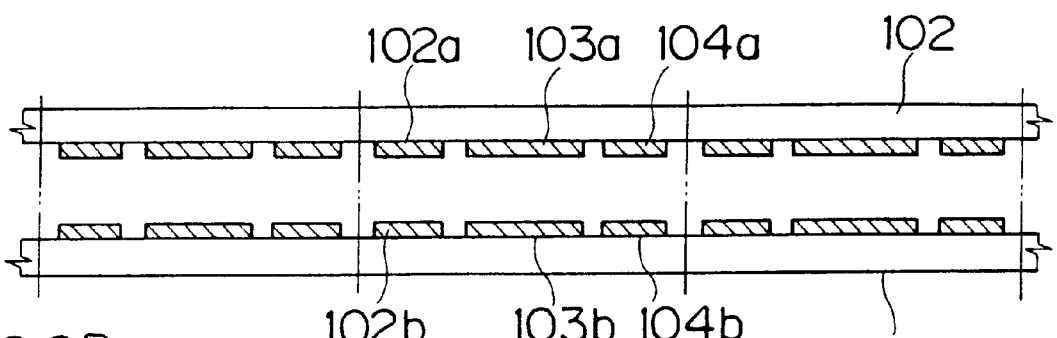
FIGS. 9A to 9C, which are adapted to illustrate another preferred method of manufacturing the piezoelectric element according to the second preferred embodiment, are an exploded perspective view for illustrating previously fired first and second piezoelectric ceramic plates which are provided with first to third internal electrodes on single surfaces, a side elevational view showing the first and second piezoelectric ceramic plates which are provided with signal drawing electrodes and polarized, and a side elevational view showing the first and second piezoelectric ceramic joined which are pasted to each other.

Previously fired mother piezoelectric ceramic plates 101 and 102 which are preferably in the form of substantially rectangular plates are first prepared as shown in FIG. 9A. Then, first to third mother internal electrode patterns 102a to 104a and 102b to 104b are formed on single major surfaces of the piezoelectric ceramic plates 101 and 102, respectively. These mother internal electrode patterns 102a to 104a and 102b to 104b are preferably formed by applying conductive paste containing silver or silver-palladium alloy powder by screen printing or the like and drying the same.

Figure 9B:
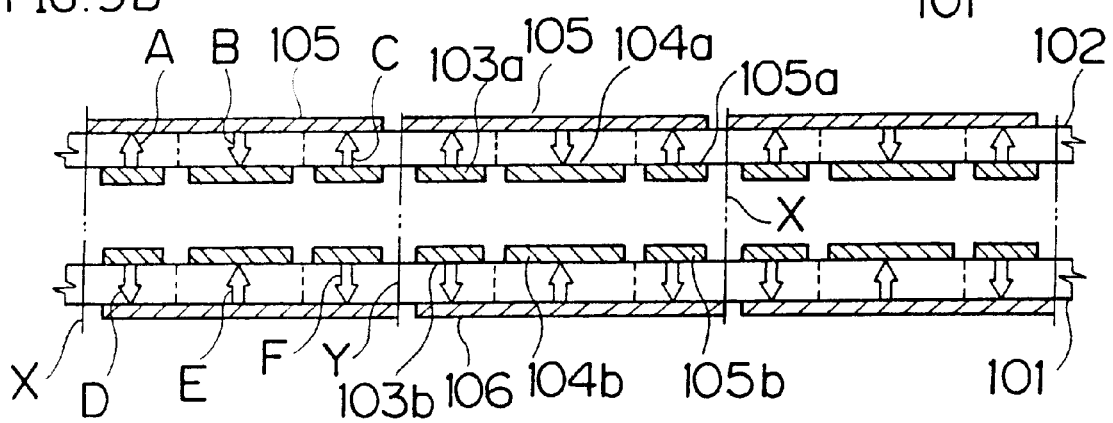

Then, first and second mother signal drawing electrode patterns 105 and 106 are formed on other surfaces of the piezoelectric ceramic plates 101 and 102 respectively, as shown in FIG. 9B. The first and second signal drawing electrode patterns 105 and 106 are formed by applying conductive paste and drying the same, similarly to the above described method. Then, the internal electrode patterns 102a to 104b and the signal drawing electrode patterns 105 and 106 are baked by heating, to be completed as electrodes, respectively.

Further, the first piezoelectric ceramic plate 101 is polarized along arrows D to F in FIG. 9B. This polarization is carried out by applying relatively high voltages, relatively low voltages, and intermediate voltages to the internal electrode patterns 102b and 104b provided on the upper surface, the internal electrode patterns 103b, and the second signal drawing electrodes 106, respectively. The piezoelectric ceramic body 102 is also polarized along arrows A to C in FIG. 9B.

After the polarization, the piezoelectric ceramic plates 101 and 102 are pasted to each other preferably through thermosetting adhesives, so that the internal electrode patterns 102a, 104a, 102b and 104b overlap with each other.

Figure 9C:
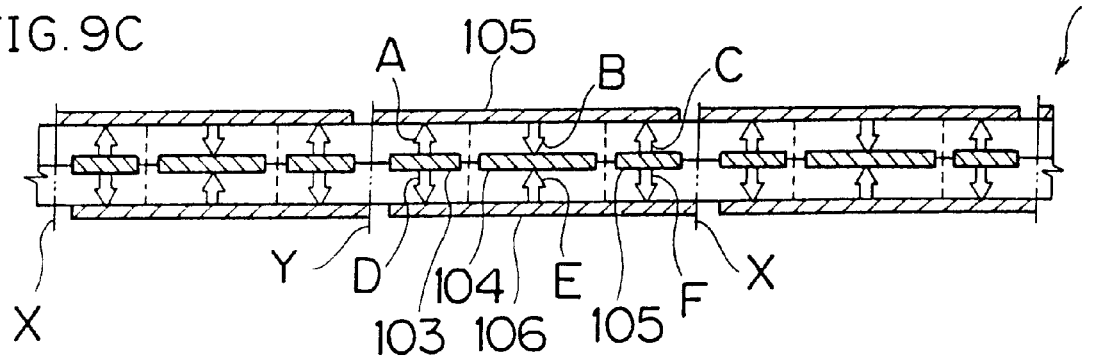

Thus, a mother piezoelectric ceramic body 107 is obtained as shown in FIG. 9C. This mother piezoelectric ceramic body 107 is similar in structure to the mother piezoelectric ceramic body 86 shown in FIG. 7C. Therefore, subsequent steps can be carried out along those described above with reference to FIGS. 8A and 8B, whereby the piezoelectric element 61 shown in FIG. 6 can be obtained in a similar manner to the above described method.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric element comprising:
   a piezoelectric body having first, second and third portions along a longitudinal direction of the piezoelectric body, the piezoelectric body being polarized such that said first and third portions are polarized in a direction opposite to polarization direction of said second portion along a thickness direction of the piezoelectric body;
   first, second and third internal electrodes being located in the interior of said piezoelectric body to extend in said longitudinal direction in said first, second and third portions while being separated from each other; and
   first and second signal drawing electrodes located on upper and lower surfaces of said piezoelectric body, respectively.

2. The piezoelectric element in accordance with claim 1, wherein regions located above and below each said internal electrode are polarized in opposite directions in each of said first, second and third portions.

3. The piezoelectric element in accordance with claim 1, wherein said piezoelectric body is made of piezoelectric ceramics.

4. An acceleration sensor comprising:
   a piezoelectric body having first, second and third portions extending alone a longitudinal direction of the piezoelectric body, the piezoelectric body being polarized such that said first and third portions are polarized in a direction opposite to a polarization direction of said second portion along a thickness direction of the Piezoelectric body;
   first, second and third internal electrodes being located in the interior of said piezoelectric body to extend in said longitudinal direction in said first, second and third portions while being separated from each other; and
   first and second signal drawing electrodes located on upper and lower surfaces of said piezoelectric body, respectively.

5. A piezoelectric element comprising:
   a piezoelectric body having first, second and third portions along a longitudinal direction of the piezoelectric body, the piezoelectric body being polarized such that said first and third portions are polarized in a direction opposite to a polarization direction of said second portion along a thickness direction of the piezoelectric body;
   first and second spaced apart external electrodes located at opposite ends of the piezoelectric body along the longitudinal direction;
   first, second and third internal electrodes located in the interior of said piezoelectric body and extending in said longitudinal direction in said first, second and third portions, respectively, while being separated from each other and spaced away from the first and second external electrodes; and
   first and second signal drawing electrodes located on upper and lower surfaces of said piezoelectric body, respectively, said first signal drawing electrode being connected to said first external electrode and said second signal drawing electrode being connected to said second external electrode.

* * * * *